United States Patent [19]

Kuo et al.

[11] Patent Number: 5,113,188
[45] Date of Patent: May 12, 1992

[54] ANALOG-TO-DIGITAL CONVERTER UTILIZING DEVICES WITH CURRENT VERSUS VOLTAGE CHARACTERISTICS WITH A PLURALITY OF PEAKS AND NEGATIVE RESISTANCE REGIONS BETWEEN PEAKS

[75] Inventors: Tai-Haur Kuo, Taipei, Taiwan; Hung C. Lin, Silver Spring, Md.

[73] Assignee: University of Maryland at College Park, College Park, Md.

[21] Appl. No.: 391,221

[22] Filed: Aug. 8, 1989

[51] Int. Cl.$^5$ ............................................. H03M 1/00
[52] U.S. Cl. .................................. 341/133; 341/131; 341/132; 341/140
[58] Field of Search ................ 341/131, 132, 133, 146, 341/140, 162

[56] References Cited

U.S. PATENT DOCUMENTS

| | | | |
|---|---|---|---|
| 3,021,517 | 2/1962 | Kaenel | 341/133 |
| 3,187,325 | 6/1965 | Waldhauer | 341/162 |
| 3,284,794 | 11/1966 | Bean | 341/133 |
| 3,569,733 | 3/1971 | Weischedel et al. | 307/222 |
| 3,701,148 | 10/1972 | Frei | 340/347 |
| 3,809,925 | 5/1974 | Hertz | 307/235 |
| 4,183,016 | 1/1980 | Sawagata | 341/131 |

OTHER PUBLICATIONS

Musa et al., "A CMOS Monolithic 3 1/2-Digit A/D Converter", IEEE Int'l Solid-State Circuits Conf. Digest of Tech. Papers, 1976, pp. 144-145.
Peterson, "A Monolithic Video A/D Converter", IEEE Journal of Solid-State Circuits, vol. SC-14, No. 6, Dec. 1979.
Arbel et al. "Fast ADC", IEEE Transactions on Nuclear Science, vol. NS-22, Feb. 1975.
Sollner et al., "Resonant Tunneling Through Quantum Wells At Frequencies Up to 2.5 THz", Appl. Phys. Lett. 43(6), Sep. 15, 1983.
Potter et al., "VB-3 A Vertically Integrated Resonant Tunneling Device with Multiple Negative Differential Resistances", IEEE Transactions on Electron Devices, vol. 35, No. 12, Dec. 1988.
Lakhani et al., "Eleven-Bit Parity Generator With A Single, Vertically Integrated Resonant Tunneling Device", Electronics Letters, May 26, 1988, vol. 24, No. 11.
Smarandoiu et al., "An All-MOS Analog-to-Digital Converter Using A Constant Slope Approach", IEEE J. Solid-State Circuits, vol. SC-11, pp. 408-410, Jun. 1976.

*Primary Examiner*—Benjamin R. Fuller
*Assistant Examiner*—Nancy Le
*Attorney, Agent, or Firm*—Martin Novack

[57] ABSTRACT

An analog-to-digital converter circuit is disclosed for receiving an analog input signal and producing a digital output having a plurality of binary bits representative of the input signal. A number of devices are utilized, each of which has a voltage versus current characteristic with a plurality of peaks, and negative resistance regions between said peaks. In the illustrated embodiments, these devices are resonant tunneling diodes. For each bit to be produced, a pair of said devices are provided, each being coupled in series arrangement with a resistor. Predetermined portions of the input signal are applied to both of the series arrangements for each respective bit to be produced. Signals from both of the series arrangements are combined for each respective bit to be produced. The combined outputs respectively represent the produced binary bits. In the preferred embodiment, the means for applying predetermined portions of the input signal comprises means for applying different fractional portions of the input signal to respective pairs of series arrangements. In this embodiment, the input signal comprises an input voltage, and a voltage offset is applied to the input signal. The transition between states ("0" to "1", or vice versa) is very fast due to the high switching speed of the narrow negative resistance region of the RTD's I-V characteristic. Also, because of the judicious use of offsets, the quantization uncertainty is one-half the last significant bit size.

20 Claims, 8 Drawing Sheets

ANALOG-TO-DIGITAL CONVERTER UTILIZING DEVICES WITH CURRENT VERSUS VOLTAGE CHARACTERISTICS WITH A PLURALITY OF PEAKS AND NEGATIVE RESISTANCE REGIONS BETWEEN PEAKS

BACKGROUND OF THE INVENTION

This invention relates to electronic circuits for analog-to-digital conversion and, more particularly, to an improved A/D converter circuit and technique.

Various types of circuits exist in the art for the important task of analog-to-digital conversion, but existing approaches suffer one or more disadvantages. So-called "dual-slope" A/D converters, commonly used in digital multimeters and other applications, can achieve high resolution, but are very slow. [See, for example, F. H. Musa et al., "A CMOS Monolithic Three And A Half Digit A/D Converter", IEEE Int'l. Solid State Circuits Conf., pp. 144-145, 1976.] At the other extreme are A/D converters based on the so-called "flash" technique [see e.g. J. G. Peterson, "A Monolithic Video A/D converter", IEEE Journal of Solid State Circuits, SC-14, No. 6, 932-937, Dec. 1979] in which for an N-bit A/D converter the input signal is simultaneously compared with $2^N-1$ reference voltages using $2^N-1$ comparators to generate $2^N-1$ outputs. The flash A/D converter also contains a rather complex digital circuit for converting the $2^N-1$ outputs from the comparators to N-bits of binary information. Thus, complexity is an obvious drawback of this approach. An alternative to the flash A/D converter has been proposed which utilizes a folding or sawtooth characteristic to achieve high speed [see A. Arbel et al., "Fast ADC", IEEE Trans. on Nuc. Sci., NS-22, 446, 1975]. However, this approach has not been widely accepted because of the need for a complex circuit to obtain the folding characteristic.

It is among the objects of the present invention to provide an A/D converter which is fast and accurate, but not unduly complex.

SUMMARY OF THE INVENTION

The present invention is directed to an analog-to-digital converter circuit for receiving an analog input signal and producing a digital output having a plurality of binary bits representative of the input signal.

In the disclosed embodiments of the invention, a number of devices are utilized, each of which has a voltage versus current characteristic with a plurality of peaks, and negative resistance regions between said peaks. In the illustrated embodiments, these devices are resonant tunneling diodes. For each bit to be produced, a pair of said devices are provided, each being coupled in series arrangement with a resistive means. Means are provided for applying predetermined portions of the input signal to both of the series arrangements for each respective bit to be produced. Means are also provided for combining signals from both of the series arrangements for each respective bit to be produced. The outputs of the combining means respectively represent the produced binary bits.

In the preferred embodiment of the invention, the means for applying predetermined portions of the input signal comprises means for applying different fractional portions of the input signal to respective pairs of series arrangements. In this embodiment, the input signal comprises an input voltage. Means are provided for applying a voltage offset to the input signal. Also, the means for applying predetermined portions of the input signal includes a voltage divider.

In one form of the invention, the means for combining signals from said respective series arrangements comprises means for adding the voltages across the respective resistive means of each said pair of series arrangements. In another form of the invention, the means for combining signals from said respective series arrangements comprises means for subtracting the voltages across the respective resistance means of each said pair of series arrangements.

The circuit of the present invention has a number of important advantages. The transition between states ("0" to "1", or vice versa) is very fast due to the high switching speed of the narrow negative resistance region of the RTDs I-V characteristic. Also, because of the judicious use of offsets, the quantization uncertainty is one-half the least significant bit size. Further, the number of RTDs necessary for an A/D converter of N bits is only 2N, as compared to $2^N-1$ devices required for some of the A/D approaches described above.

Further features and advantages of the invention will become more apparent from the following detailed description when taken in conjunction with the accompanying drawings.

DESCRIPTION OF THE PREFERRED EMBODIMENTS

Figure 1:
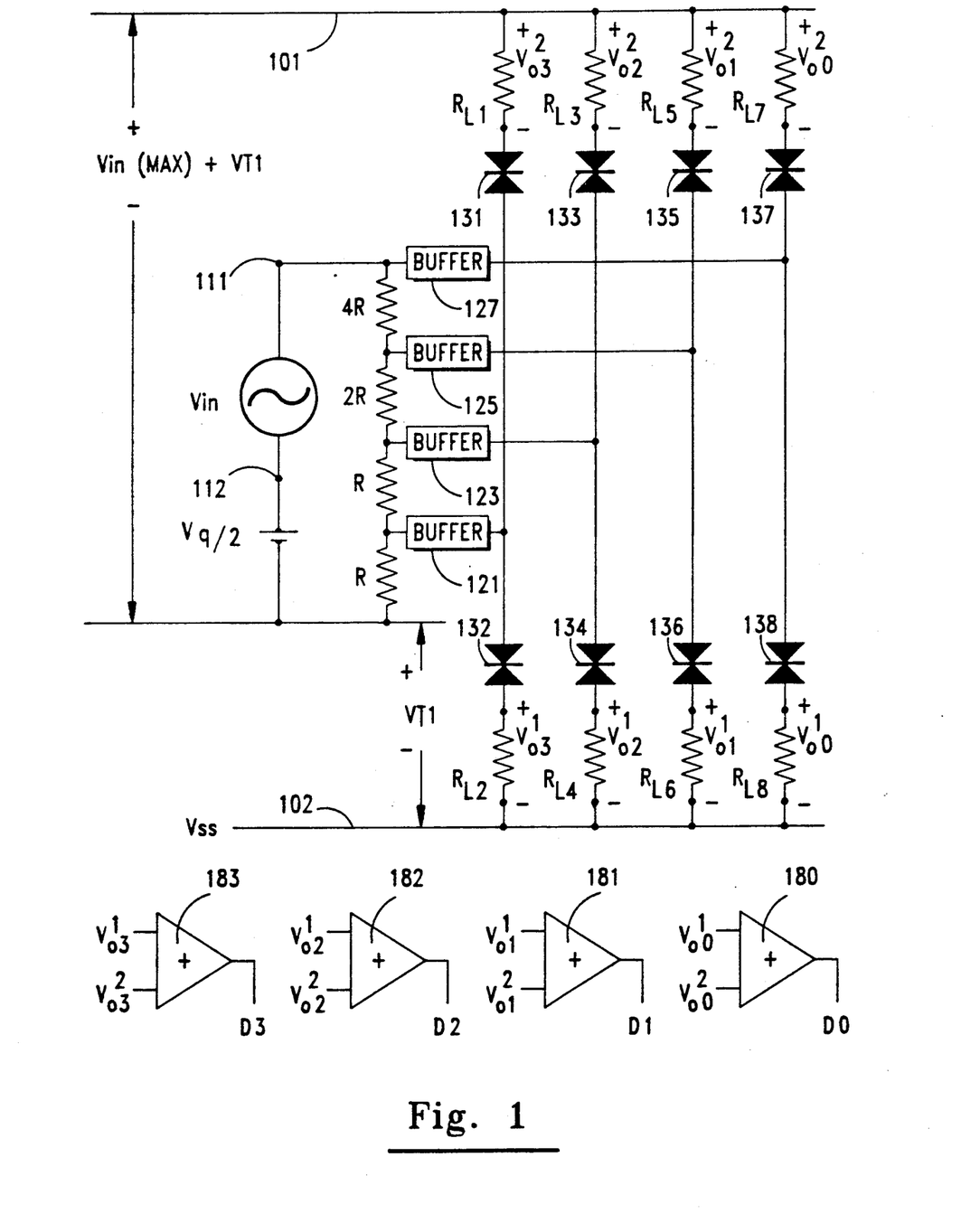
FIG. 1 is a schematic diagram, partially in block form, of an analog-to-digital converter in accordance with an embodiment of the invention.

Referring to FIG. 1, there is shown an analog-to-digital converter in accordance with an embodiment of the invention. An input analog voltage, $V_{in}$, to be digitized, is applied across terminals 111 and 112. The terminal 111 is coupled to one end of a voltage divider which comprises resistors designated 4R, 2R, R, and R. The terminal 112 is coupled to the positive side of a DC voltage source, $V_q/2$, which is used as an offset voltage, as will be described hereinbelow. The DC voltage source is coupled between the terminal 112 and the other end of the voltage divider. Each position of the voltage divider is coupled, via a buffer, to the junction between a pair of resonant tunneling diodes (RTDs). In particular, the buffers are designated 121, 123, 125 and 127, and the buffer 121 couples to the junction between RTD 131 and RTD 132, the buffer 123 couples to the junction between RTD 133 and RTD 134, the buffer 125 couples to the junction between RTD 135 and RTD 136, and the buffer 127 couples to the junction between RTD 137 and RTD 138. The RTDs may be of any suitable type which has a voltage versus current characteristic with multiple peaks and negative resistance regions between the peaks, as described further hereinbelow. The buffers are used to drive the RTD circuits to furnish a suitable output impedance for the input voltages to the RTDs.

Each of the RTDs has an associated load resistor, as seen in the diagram, the load resistors each having a value $R_L$ in the present embodiment. The load resistors $R_{L1}$, $R_{L3}$, $R_{L5}$ and $R_{L7}$ are coupled to a rail 101, and the load resistors $R_2$, $R_{L4}$, $R_{L6}$ and $R_{L8}$ are coupled to a rail 102. In the present embodiment, the rail 101 is at a voltage $V_{in(max)} + VT1$ with respect to the bottom of the voltage divider, and the rail 102 is at a voltage $-VT1$ with respect to the bottom of the voltage divider. The labelled voltage across each load resistor, as explained further hereinbelow, is as indicated in the Figure.

Four summing amplifiers 180, 181, 182 and 183 are provided. Each of the summing amplifiers is operative to sum the voltage across the load resistors associated with an adjacent pair of RTDs. Thus, the summing amplifier 180 sums the voltages across load resistors $R_{L7}$ and $R_{L8}$, the summing amplifier 181 sums the voltages across load resistors $R_{L5}$ and $R_{L6}$, the summing amplifier 182 sums the voltages across load resistors $R_{L3}$ and $R_{L4}$, and the summing amplifier 183 sums the voltages across load resistors $R_{L1}$ and $R_{L2}$. The outputs of the summing amplifiers are respectively the least significant bit (output of summing amplifier 180—$D_0$) to the most significant bit (output of summing amplifier 183—$D_3$) of the binary type of digital code (a gray code, in this case) generated by the circuit.

Figure 2:
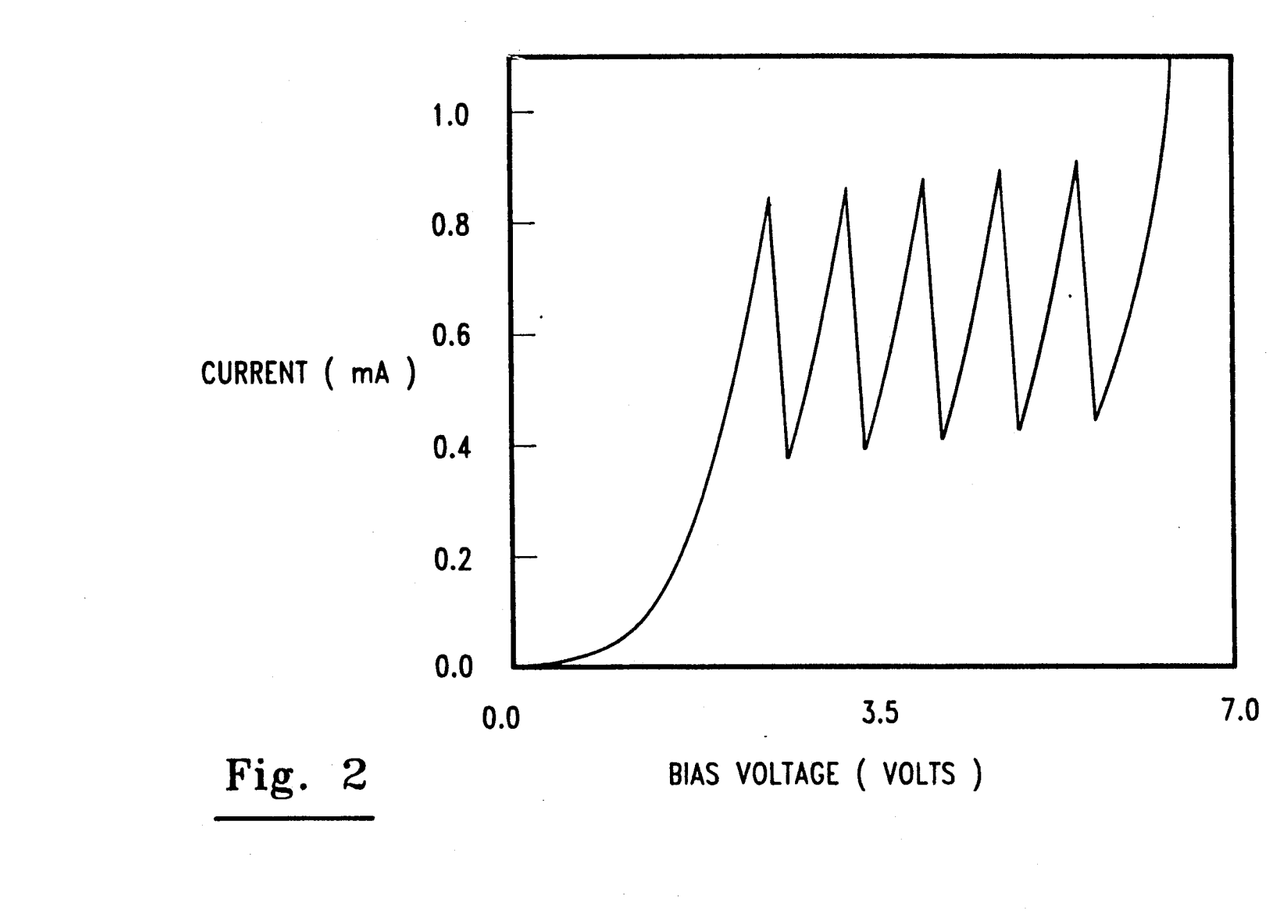
FIG. 2 shows the current vs. voltage characteristic of a five quantum well RTD device.

To better understand operation of the FIG. 1 embodiment, the following description is set forth in conjunction with FIGS. 2-11. FIG. 2 shows the current vs. voltage (I-V) characteristic of a five quantum well RTD device. The illustrated characteristic is seen to have five substantially symmetrical peaks in its I-V characteristic. As is known, by varying the thickness of the barrier and spacer layers, one can tailor the peak-to-peak voltage, the peak-to-valley ratio, and the peak current of the RTD. [For description of the fabrication and electrical characteristics of a multi-well InGaAs/InAlAs RTD, reference can be made, for example, to A. Lakhani et al., "Eleven-Bit Parity Generator With A Single, Vertically Integrated Resonant Tunnelling Device", Electron Lett., 24, 681-683 (1988), and R. Potter et al., "A Vertically integrated Resonant Tunnelling Device With Multiple Negative Differential Resistances", Device Research Conference, Boulder, Colo. (1988).]

Figure 3A:
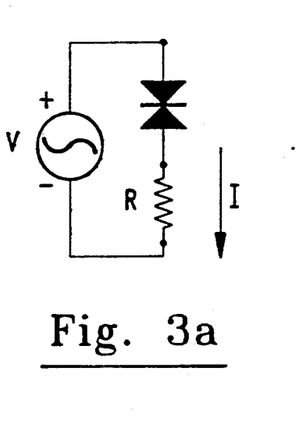
FIG. 3a illustrates an RTD in series with a resistor.
Figure 3B:
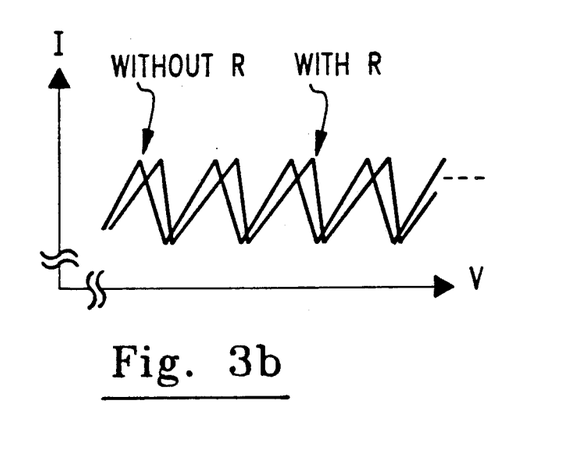
FIG. 3b illustrates the I-V characteristic of an RTD with and without a series resistor.

FIG. 3b shows the I-V characteristic of an RTD with and without a series resistor. The characteristic marked "Without R" is the type of sawtooth first shown in FIG. 2. When an RTD is connected in series with a resistor, as illustrated in FIG. 3a, the slope of the positive resistance region of the I-V curve becomes more gradual and this region becomes wider. The negative resistance region becomes steeper and narrower. By suitably choosing the resistance R of the FIG. 3b circuit (e.g. a resistance that is approximately equal to the negative resistance of the negative resistance regions of the RTD), the width of the negative resistance region can be reduced so that it is negligible compared to the width of the positive resistance region.

Figures 4A, 4B:
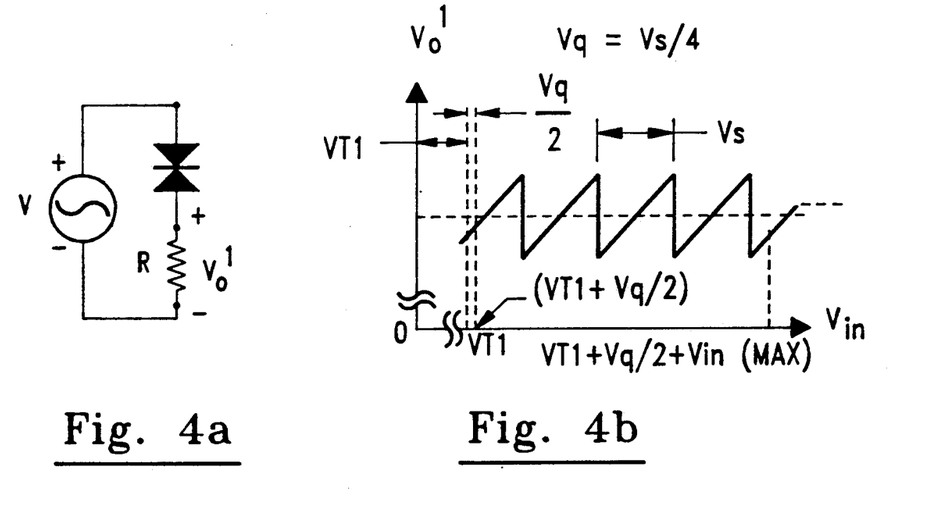
FIG. 4a illustrates a circuit arrangement useful in understanding the invention.
FIG. 4b illustrates the behavior of the voltage across the resistor of the FIG. 4a circuit.

In the diagram of FIG. 4a, the voltage across the resistance R is designated $V_0^1$, and in the accompanying curve of FIG. 4b, which shows the voltage $V_0^1$ as a function of $V_{in}$, the voltage between successive peaks is designated $V_s$. As also seen in FIG. 4b, the voltage to the onset of the first symmetrical positive resistance portion of the sawtooth waveform is designated VT1, and $V_q$ is equal to $V_s/4$.

Figure 5A:
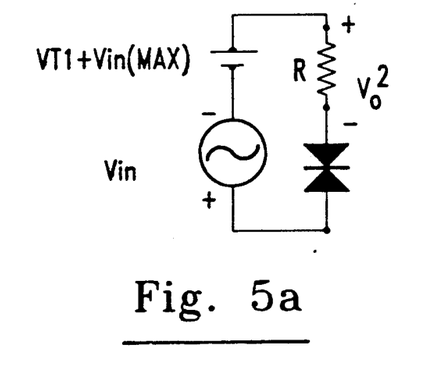
FIG. 5a illustrates another circuit arrangement useful in understanding the invention.
Figure 5B:
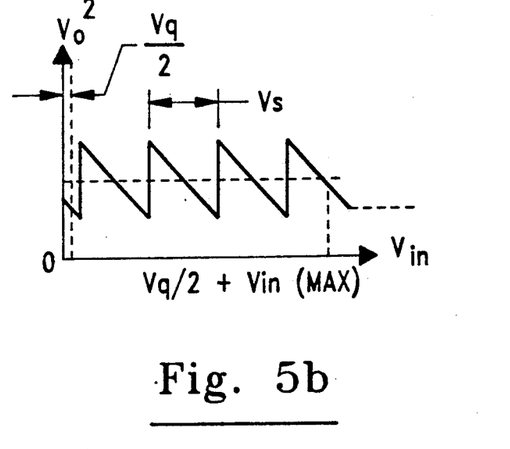
FIG. 5b illustrates the behavior of the voltage across the resistor of the FIG. 5a circuit.
Figure 6A:
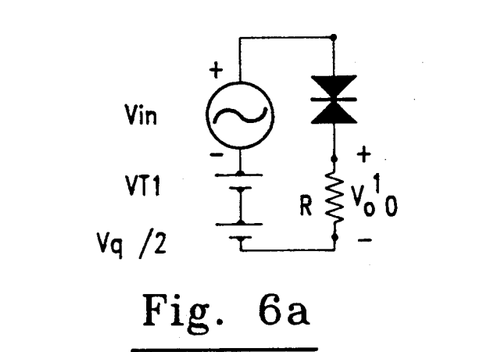
FIG. 6a illustrates another circuit arrangement useful in understanding the invention.
Figure 6B:
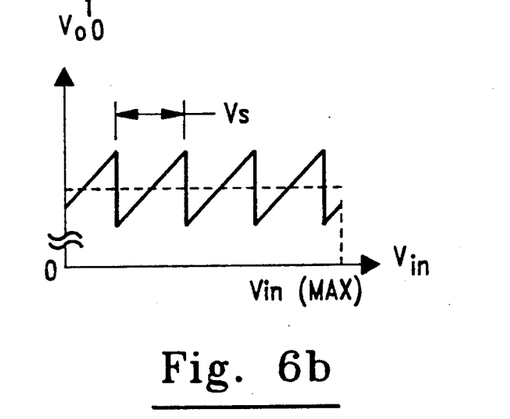
FIG. 6b illustrates the behavior of the voltage across the resistor of the FIG. 6a circuit.
Figure 7A:
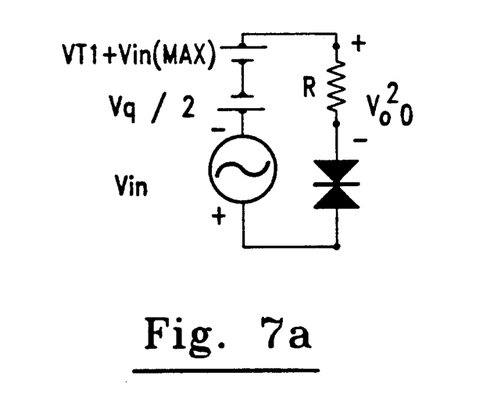
FIG. 7a illustrates another circuit arrangement useful in understanding the invention.
Figure 7B:
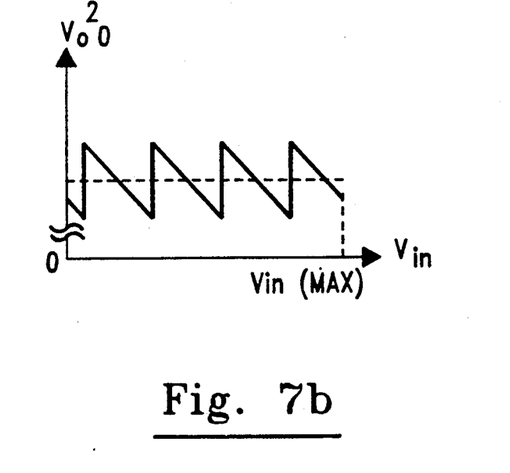
FIG. 7b illustrates the behavior of the voltage across the resistor of the FIG. 7a circuit.
Figure 8A:
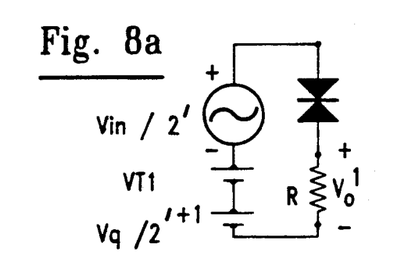
FIG. 8a illustrates another circuit arrangement that is useful in understanding the invention.

Consider next the modification of the FIG. 4a circuit to obtain the circuit of FIG. 5a; i.e. addition of the DC voltage $VT1 + V_{in(max)}$ in the configuration shown. FIG. 5b illustrates $V_0^2$ (the voltage across the resistor R in FIG. 5a) as a function of $V_{in}$, and it is seen that the curve of FIG. 5b is the reverse of that shown in FIG. 4b. When the circuit of FIG. 4a is offset by $VT1 + V_q/2$, as shown in FIG. 6a, the curve of FIG. 4b is offset by a DC voltage $VT1 + V_q/2$. If $V_{in}$ ranges from zero to a maximum voltage $V_{in(max)}$, then the $V_0^1 - V_{in}$ curve becomes FIG. 6b. In similar manner, the curve of FIG. 7b is obtained from the circuit of FIG. 7a. When $V_{in}$ and $V_q/2$ of FIG. 6a are divided by $2^L$ as shown in FIG. 8a, one gets the curves of FIG. 8b through FIG. 8e (for L=0,1,2 and 3, respectively). [It can be noted that the curve of FIG. 8b (i.e., for L=0 is the same as that of FIG. 6b.] Similarly, for the values of L=0,1,2 and 3 in FIG. 9a, one gets the curves of FIGS. 9b, 9c, 9d and 9e, respectively. [The curve of FIG. 9b (i.e., for L=0) is the same as that of FIG. 7b.]

Figure 8B:
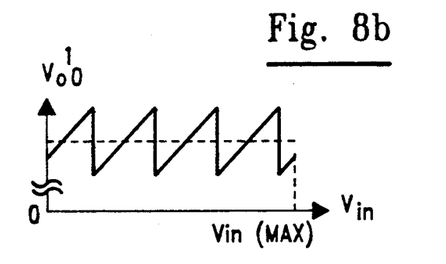
FIGS. 8b-8e are waveforms which illustrate the behavior of the voltage across the resistor of FIG. 8a for different fractions of the input voltage.
Figure 8C:
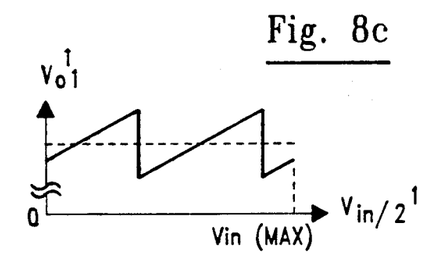
Figure 8D:
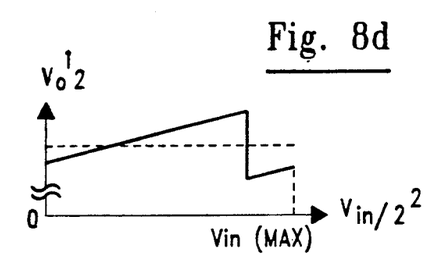
Figure 8E:
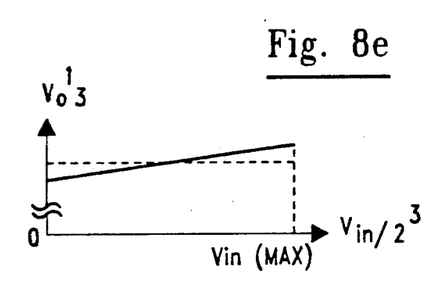
Figure 9A:
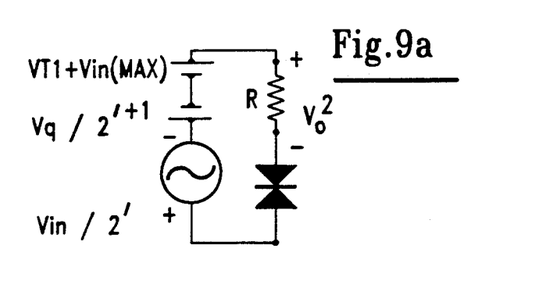
FIG. 9a illustrates another circuit that is useful in understanding the invention.
Figure 9B:
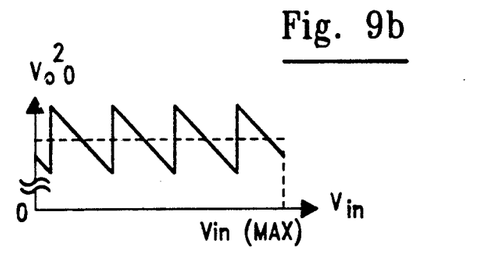
FIGS. 9b-9e are waveforms which illustrate the behavior of the voltage across the resistor of FIG. 9a for different fractions of the input voltage.
Figure 9C:
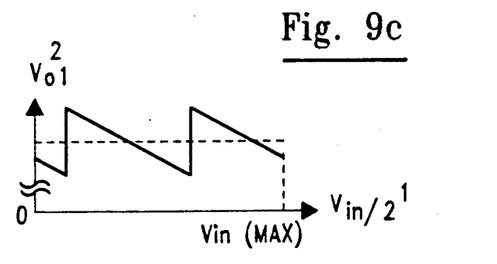
Figure 9D:
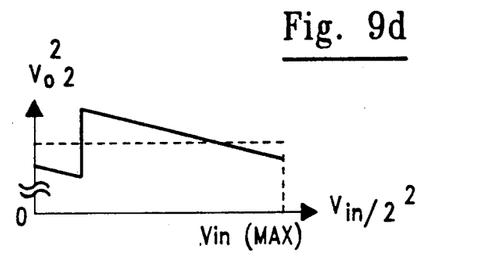
Figure 9E:
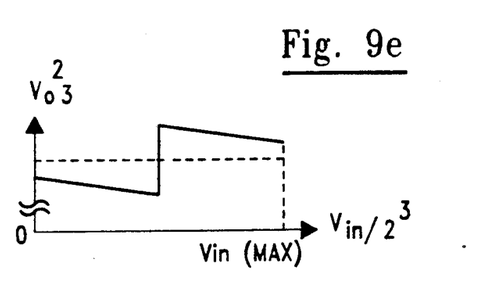
Figures 10B, 10C:
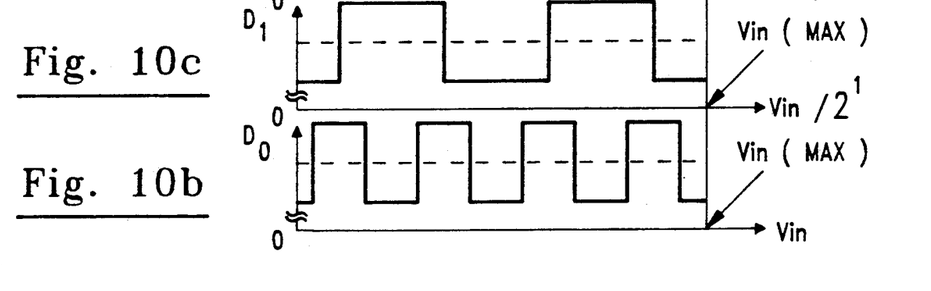
FIGS. 10b-10e illustrate square waves obtained by adding the waveforms of FIGS. 8b-8e to the waveforms of FIGS. 9b-9e, respectively.
Figures 10D, 10E:
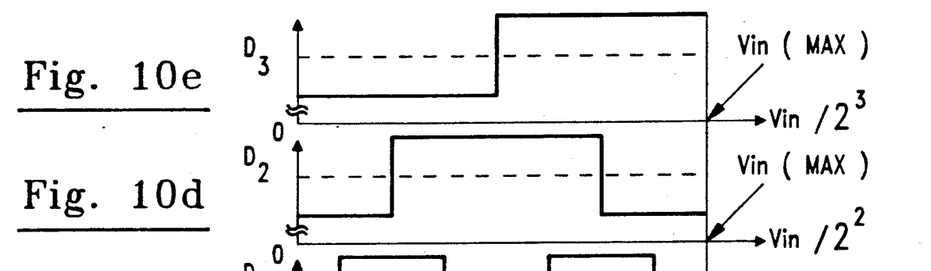

When the curves of FIGS. 8b and 9b are summed (e.g. by summing the voltages across the resistors of FIGS. 8a and 9a), one obtains the square waveform of FIG. 10b. Similarly, summing the curves of FIGS. 8c and 9c results in the square waveform of FIG. 10c, summing the curves of FIGS. 8d and 9d results in the square waveform of FIG. 10d, and summing the curves of FIGS. 8e and 9e results in the square waveform of FIG. 10e.

The circuit of FIG. 1 will now be more readily understood. The input voltage to be digitized is applied as $V_{in}$, the voltage $V_q/2$ is the voltage offset described above, and the voltage divider serves to divide the offset input voltage into the appropriate fractions for application to the respective pairs of series arrangements of RTDs and resistors. The voltages across the resistors of each associated pair of series arrangements are added by summing amplifiers 180, 181, 182 and 183.

Figure 10F:
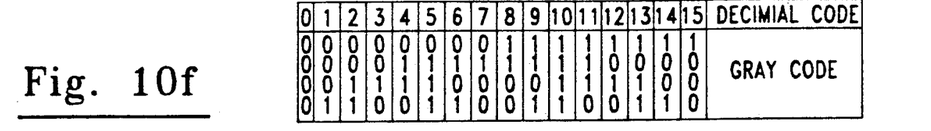
Figure 11:
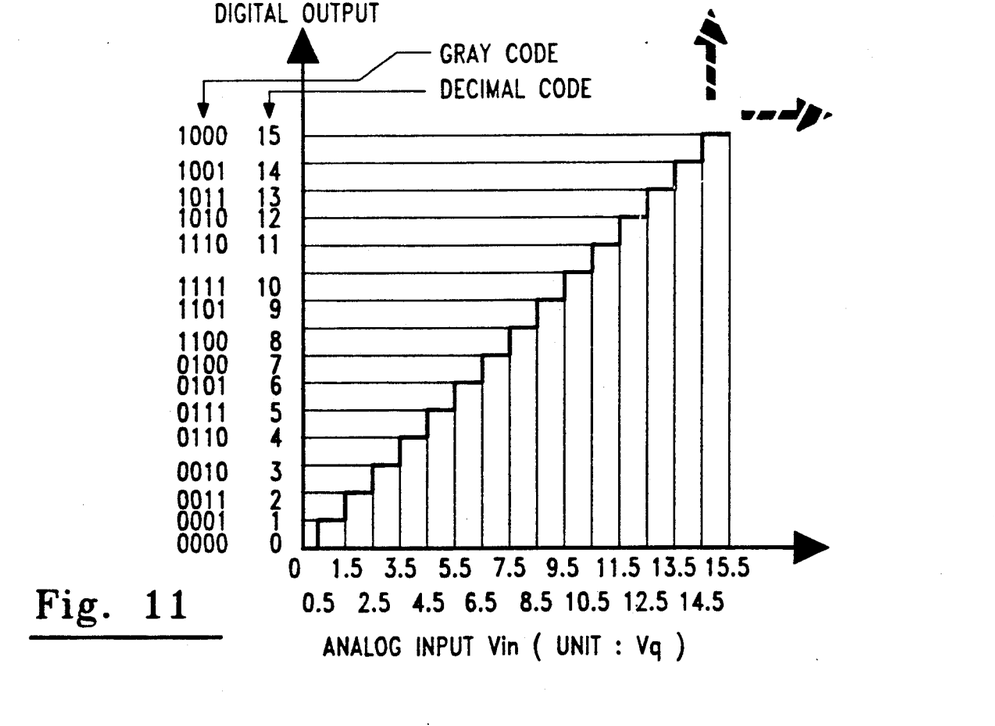
FIG. 11 is a graph showing the ideal transfer curve of the A/D converter hereof for a gray code.

Referring again to FIGS. 10b through 10e, it is seen that in the present embodiment the outputs of the summing amplifiers of FIG. 1, represented as the output bits $D_1$ (FIG. 10e—most significant bit), $D_2$ (FIG. 10d—second most significant bit), $D_3$ (FIG. 10c—third most significant bit), and $D_4$ (FIG. 10b—least significant bit), produce a gray code digital representation of the analog input signal, $V_{in}$, as shown in the table of FIG. 10f. The ideal transfer code for this embodiment A/D converter, which produces gray code, is shown in FIG. 11. It will be understood, however, that any desired kind of binary code can be obtained by selecting the appropriate offsets, bias voltages, and voltage divider values.

Referring again to the waveforms of FIGS. 10b-10e it is seen that because of the insertion of offset voltage $V_q/2$ the waveform of FIG. 10b is shifted by one-half the least significant bit (LSB) so that the width of "0000" is only half the width of the other codes. This reduces the ideal maximum quantization uncertainty from 1 LSB to $\frac{1}{2}$ LSB. The transition from a "0" to a "1" state, or vice versa, is very fast due to the high switching speed of the narrow negative resistance region of the RTD's I-V characteristic.

Figure 12:
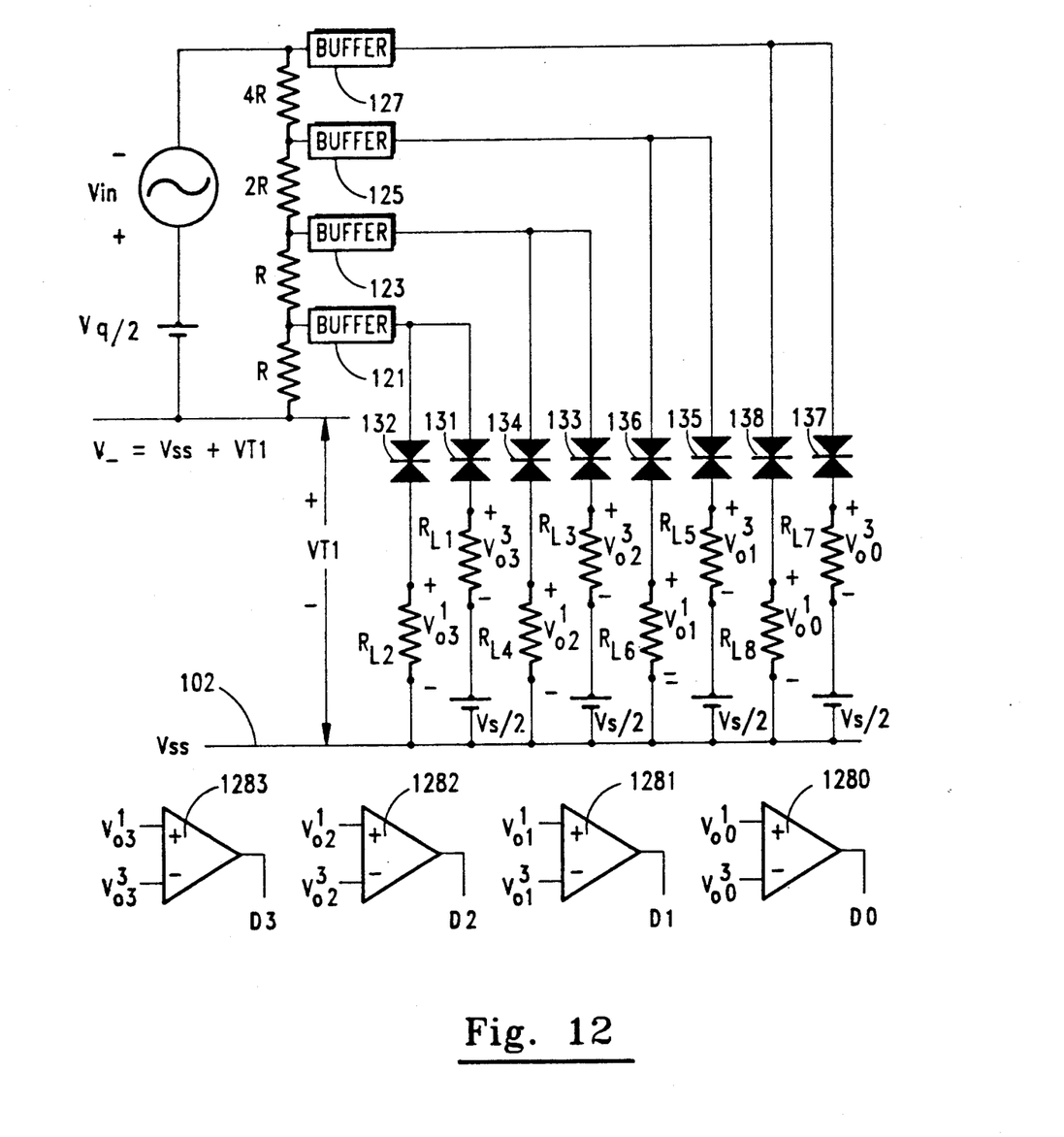
FIG. 12 is a schematic diagram, partially in block form, of an analog-to-digital converter in accordance with another embodiment of the invention.

As seen above, the embodiment of FIG. 1 was produced using square waves obtained by adding appropriately offset sawtooth waves, one of which has rising ramps after each negative resistance region, and the other of which has falling ramps after each negative resistance region. The square waves can alternatively be obtained by subtracting offset sawtooth waves which both have rising ramps or by subtracting sawtooth waves which both have falling ramps. The embodiment of FIG. 12 uses subtraction of sawtooth waveforms with rising ramps. The input signal $V_{in}$, offset voltage $V_q/2$, voltage divider, and RTDs are like their counterparts in the FIG. 1 embodiment. In the FIG. 12 embodiment, however, all the load resistors are coupled to the rail 102, with the resistors $R_{L1}$, $R_{L3}$, $R_{L5}$ and $R_{L7}$ being coupled to rail 102 via a DC voltage $V_s/2$. Difference amplifier 1280 subtracts the voltage across $R_{L7}$ from the voltage across $R_{L8}$ to obtain bit $D_0$. Similarly, difference amplifiers 1281, 1282, and 1283 derive bits D1, D2, and D3, respectively, by subtracting voltages as indicated in FIG. 12.

Figure 13:
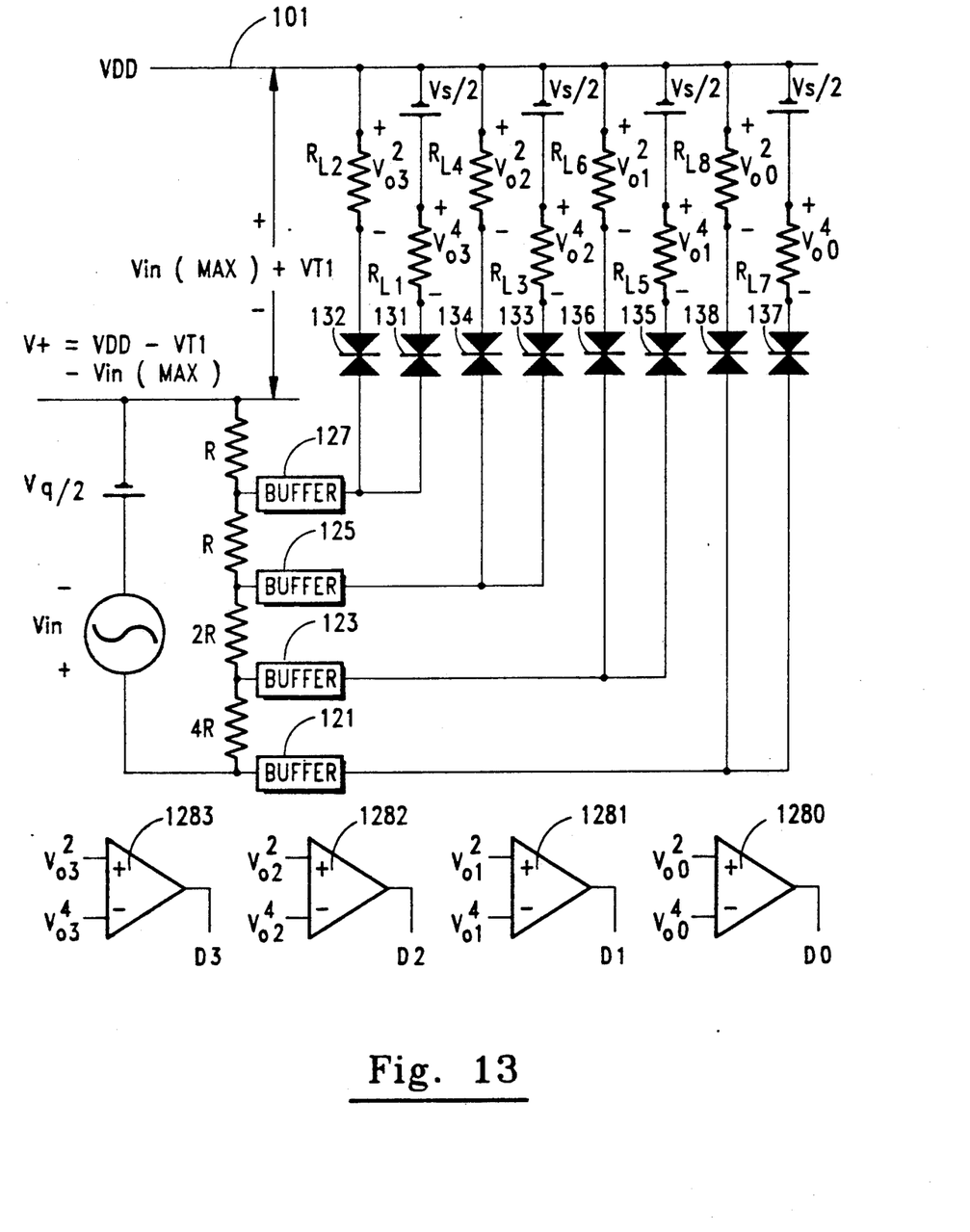
FIG. 13 is a schematic diagram, partially in block form, of an analog-to-digital converter in accordance with still another embodiment of the invention.

The embodiment of FIG. 13 uses subtraction of sawtooth waveforms with falling ramps. The circuit is similar to that of FIG. 12 (with like reference numerals for like components), except that the resistors are all coupled to rail 101, as shown.

The invention has been described with reference to particular preferred embodiments, but variations within the spirit and scope of the invention will occur to those skilled in the art. For example, as noted above, while the illustrated embodiments produce gray code, it will be understood that any desired kind of binary code can be obtained by selecting the appropriate offsets, bias voltages, and voltage divider values. Also, while RTDs are found to have I-V characteristics that are particularly suitable for use in the invention, other devices having the specified characteristics may also be employed.

We claim:

1. An analog-to-digital converter circuit for receiving an analog input signal and producing a digital output having a plurality of binary bits representative of said input signal, comprising:
   a number of devices each having current versus voltage characteristics with a plurality of peaks, and negative resistance regions between said peaks;
   for each bit to be produced, a pair of subcircuits each including one of said devices coupled in series arrangement with a respective resistive element, said subcircuits for each bit being coupled together at a junction between said devices;
   means for applying a respective different predetermined portion of said input signal to said junction of said pair of subcircuits for each respective bit to be produced; and
   means for combining signals obtained from the resistive element of both of the pair of subcircuits for each respective bit to be produced;
   whereby outputs of said combining means respectively represent produced binary bits.

2. An analog-to-digital converter circuit as defined by claim 1, wherein said means for applying a respective different predetermined portion of said input signal to said junction of the pair of subcircuits for each respective bit to be produced comprises means for applying different fractional portions of said input signal to respective pairs of subcircuits.

3. An analog-to-digital converter circuit as defined by claim 1, wherein said input signal comprises an input voltage and said means for applying a respective different predetermined portion of said input signal to said junction of the pair of subcircuits for each respective bit to be produced includes a voltage divider.

4. An analog-to-digital converter circuit as defined by claim 2, wherein said input signal comprises an input voltage and said means for applying a respective different predetermined portion of said input signal to said junction of the pair of subcircuits for each respective bit to be produced includes a voltage divider.

5. An analog-to-digital converter circuit as defined by claim 1, further comprising means for applying a voltage offset to said input signal.

6. An analog-to-digital converter circuit as defined by claim 3, further comprising means for applying a voltage offset to said input signal.

7. An analog-to-digital converter circuit as defined by claim 4, further comprising means for applying a voltage offset to said input signal.

8. An analog-to-digital converter circuit as defined by claim 1, wherein said means for combining signals obtained from the resistive element of both of the pair of subcircuits for each respective bit to be produced comprises means for adding the voltages across the respective resistive element of each said pair of subcircuits.

9. An analog-to-digital converter circuit as defined by claim 4, wherein said means for combining signals obtained from the resistive element of both of the pair of subcircuits for each respective bit to be produced comprises means for adding the voltages across the respective resistive element of each said pair of subcircuits.

10. An analog-to-digital converter circuit as defined by claim 7, wherein said means for combining signals obtained from the resistive element of both of the pair of subcircuits for each respective bit to be produced comprises means for adding the voltages across the respective resistive element of each said pair of subcircuits.

11. An analog-to-digital converter circuit as defined by claim 1, wherein said means for combining signals obtained from the resistive element of both of the pair of subcircuits for each respective bit to be produced comprises means for subtracting the voltages across the respective resistive element of each said pair of subcircuits.

12. An analog-to-digital converter circuit as defined by claim 4, wherein said means for combining signals obtained from the resistive element of both of the pair of subcircuits for each respective bit to be produced comprises means for subtracting the voltages across the respective resistive element of each said pair of subcircuits.

13. An analog-to-digital converter circuit as defined by claim 7, wherein said means for combining signals obtained from the resistive element of both of the pair of subcircuits for each respective bit to be produced comprises means for subtracting the voltages across the respective resistive element of each said pair of subcircuits.

14. An analog-to-digital converter circuit as defined by claim 1, wherein each of said devices comprises a resonant tunneling diode.

15. An analog-to-digital converter circuit as defined by claim 4, wherein each of said devices comprises a resonant tunneling diode.

16. An analog-to-digital converter circuit as defined by claim 7, wherein each of said devices comprises a resonant tunneling diode.

17. An analog-to-digital converter circuit as defined by claim 8, wherein each of said devices comprises a resonant tunneling diode.

18. An analog-to-digital converter circuit as defined by claim 11, wherein each of said devices comprises a resonant tunneling diode.

19. An analog-to-digital converter circuit as defined by claim 1, wherein said devices have substantially symmetrical peaks in their voltage versus current characteristics.

20. An analog-to-digital converter circuit as defined by claim 7, wherein said devices have substantially symmetrical peaks in their voltage versus current characteristics.

* * * * *